(12) United States Patent
Goswami et al.

(10) Patent No.: US 7,622,388 B2
(45) Date of Patent: Nov. 24, 2009

(54) METHODS OF FORMING TITANIUM-CONTAINING MATERIALS

(75) Inventors: Jaydeb Goswami, Boise, ID (US); Joel A. Drewes, Boise, ID (US)

(73) Assignee: Micron Technolyg, Inc., Boise, ID (US)

( * ) Notice: Subject to any disclaimer, the term of this patent is extended or adjusted under 35 U.S.C. 154(b) by 0 days.

(21) Appl. No.: 12/044,253

(22) Filed: Mar. 7, 2008

(65) Prior Publication Data

US 2008/0171437 A1 Jul. 17, 2008

Related U.S. Application Data

(62) Division of application No. 11/168,856, filed on Jun. 28, 2005, now Pat. No. 7,361,596.

(51) Int. Cl.
 *H01L 21/44* (2006.01)
(52) U.S. Cl. .............................. 438/683; 257/E21.593
(58) Field of Classification Search .................. 438/683; 257/E21.593
See application file for complete search history.

(56) References Cited

U.S. PATENT DOCUMENTS

| 4,619,038 A | 10/1986 | Pintchovski |
| 7,049,702 B2 | 5/2006 | Tseng |
| 2004/0180543 A1 | 9/2004 | Lee et al. |

OTHER PUBLICATIONS

Osama A. Fouad, et al. "Titanium disilicide formation by rf plasma enhanced chemical vapor deposition and film properties" Elsevier Science 2002, pp. 159-166.

Robert Beyers, et al. "Metastable phase formation in titanium-silicon thin films" Journal of Applied Physics 57(12), Jun. 15, 1985 pp. 5240-5245.

*Primary Examiner*—W. David Coleman
*Assistant Examiner*—Sonya D McCall-Shepard
(74) *Attorney, Agent, or Firm*—Well St. John P.S.

(57) ABSTRACT

The invention includes methods of forming titanium-containing materials, such as, for example, titanium silicide. The invention can use alternating cycles of titanium halide precursor and one or more reductants to form the titanium-containing material. For instance, the invention can utilize alternating cycles of titanium tetrachloride and activated hydrogen to form titanium silicide on a surface of a silicon-containing substrate.

15 Claims, 3 Drawing Sheets

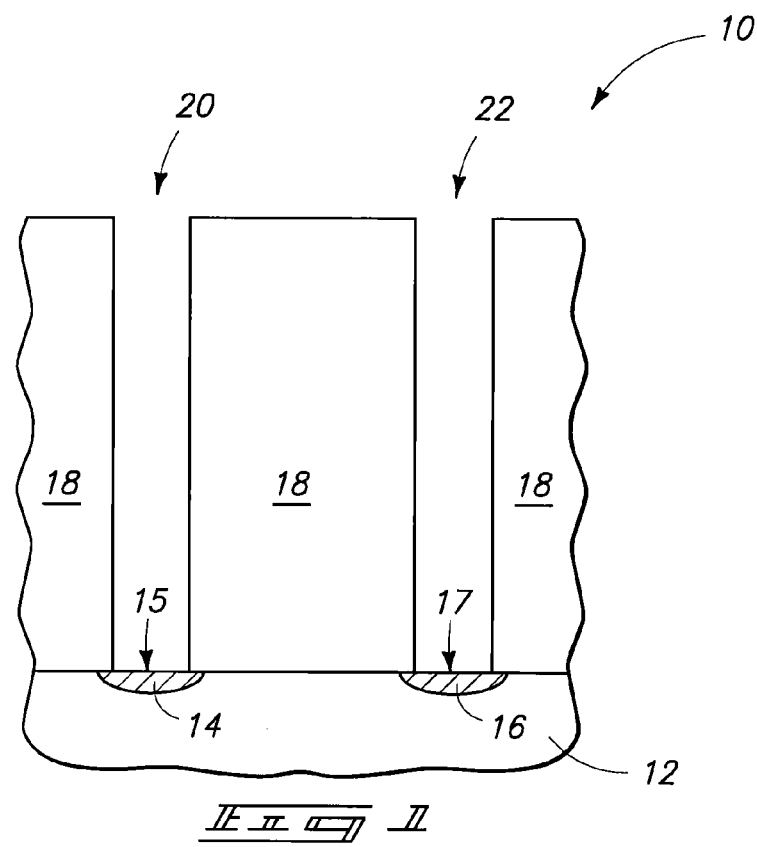
_Fig. 1_
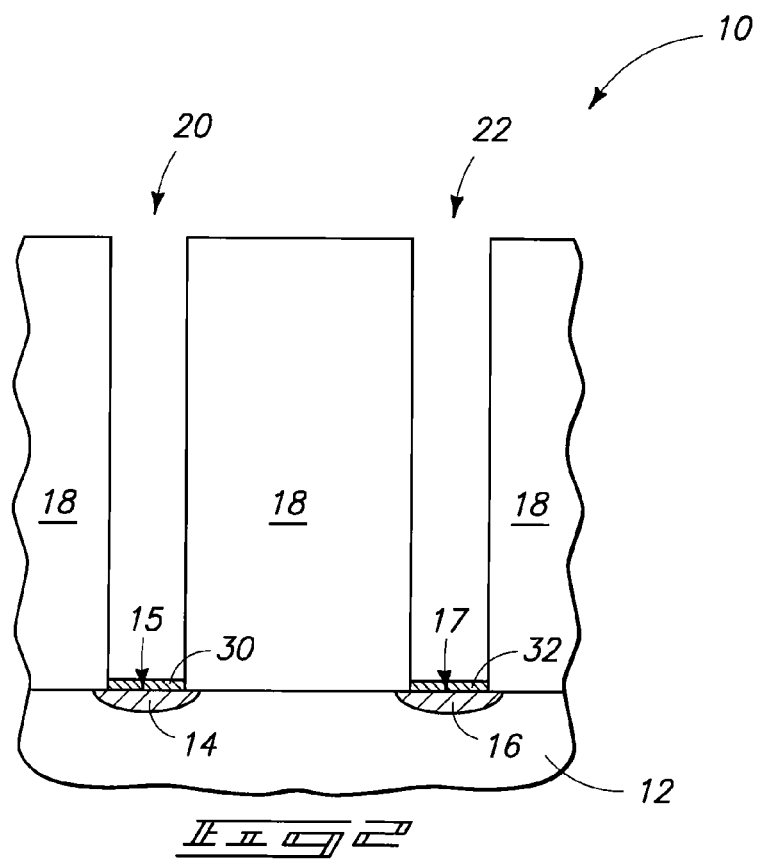
_Fig. 2_

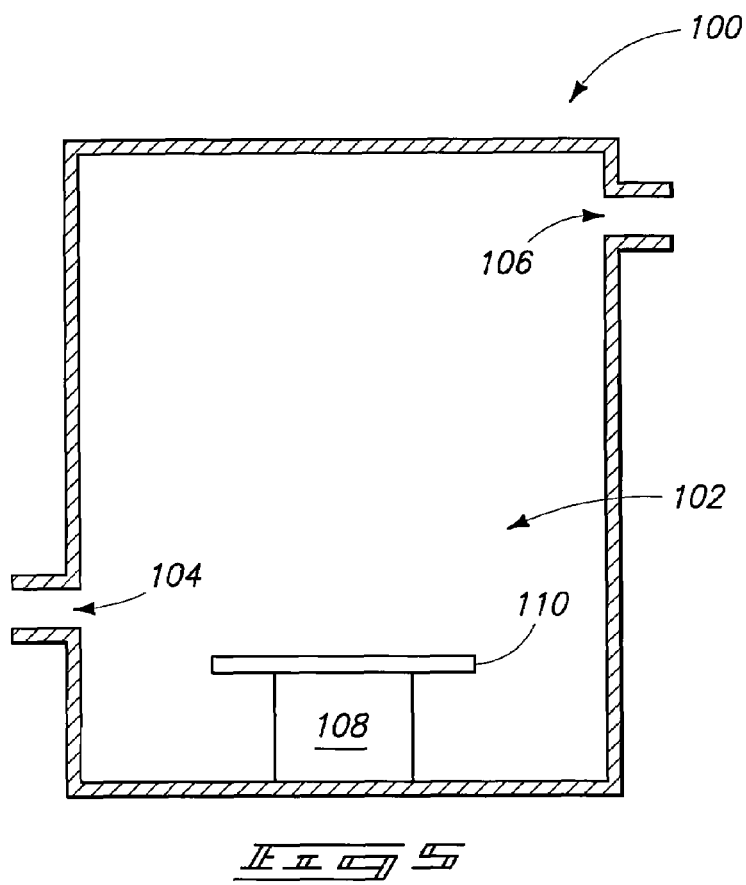
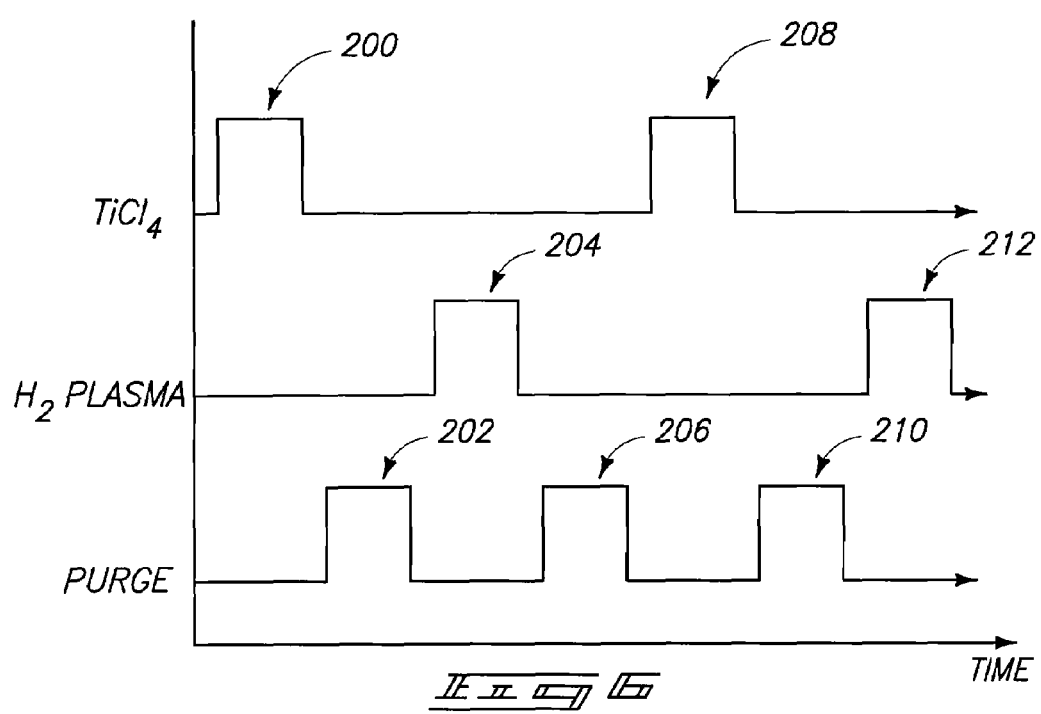

METHODS OF FORMING TITANIUM-CONTAINING MATERIALS

RELATED PATENT DATA

This patent resulted from a divisional of U.S. patent application Ser. No. 11/168,856, which was filed Jun. 28, 2005, which is now U.S. Pat. No. 7,361,596, and which is hereby incorporated herein by reference.

TECHNICAL FIELD

The invention pertains to methods of forming titanium-containing materials, such as, for example, titanium silicide.

BACKGROUND OF THE INVENTION

The low resistivity phase (C-54) of titanium silicide makes titanium silicide particularly attractive for contact and interconnect metallization. However, as the level of integration increases (in other words, as device size shrinks) the use of titanium silicide becomes increasingly challenging. It is difficult to achieve low resistive contacts at the bottom of high-aspect-ratio narrow holes with titanium silicide due to agglomeration and incomplete phase transformation from the high resistivity phase (C-49) to the low resistivity phase (C-54). The phase transformation is utilized because typical deposition methods form the high resistivity C-49 phase, and so post-deposition annealing is generally included during formation of titanium silicide structures to convert the high resistivity C-49 phase to the low resistivity C-54 phase.

Physical vapor deposition (PVD) techniques, such as evaporation and sputtering, are well known processes for depositing titanium films, and additionally chemical vapor deposition (CVD) is also a widely-used technique for forming titanium films in the semiconductor industry. However, conventional techniques for forming titanium films have several shortcomings when utilized for forming titanium silicide in very high-aspect-ratio openings (such as, for example, openings having an aspect ratio of 20 or greater). Such shortcomings can include difficulties in forming the low resistivity C-54 phase, even with a post-deposition anneal; excessive silicon consumption; and agglomeration. Accordingly, it is desirable to develop new methodologies for forming titanium silicide in semiconductor applications.

SUMMARY OF THE INVENTION

In one aspect, the invention includes a method for forming low resistivity $TiSi_2$ (in other words, the C-54 phase) at a low temperature (with an exemplary temperature being from about 550° C. to about 700° C.), utilizing alternating cycles of titanium halide precursor (such as, for example, titanium tetrachloride ($TiCl_4$)) and activated hydrogen (such as, for example, hydrogen from a $H_2$ plasma) in a deposition process. The process initially grows a titanium halide layer during the titanium halide precursor cycle, and then converts the titanium halide layer to a titanium silicide layer during the activated hydrogen cycle. The growth of the titanium halide layer can be self-limiting, and accordingly the processing can enable a controlled amount of $TiSi_2$ to be formed. Additionally, the present invention can advantageously directly form the C-54 phase of titanium, and accordingly post-annealing associated with prior art silicidation processes can be avoided.

In one aspect of the invention, the deposition of titanium silicide can be selective for formation on a semiconductor material relative to other materials. For instance, a process of the present invention can selectively form titanium silicide over a monocrystalline silicon surface relative to other surfaces comprising one or more of silicon dioxide, silicon nitride, silicon oxynitride, aluminum oxide, and carbon.

In one aspect, the invention includes a method of forming titanium-containing material. A semiconductor substrate is exposed to one or more titanium-containing precursors in the absence of one or more reductants to form a titanium-containing layer on the substrate. Titanium from the titanium-containing layer is reacted with semiconductor material of the substrate to form the desired titanium-containing material, with the formation of the titanium-containing material comprising exposure of the titanium-containing layer to the one or more reductants.

In one aspect, the invention encompasses a method of forming titanium silicide. A silicon-containing substrate is exposed to at least one titanium-containing precursor in the absence of hydrogen-containing fluid to form a titanium-containing layer on the substrate. Titanium silicide is formed from titanium of the titanium-containing layer, with the formation of the titanium silicide comprising exposure of the titanium-containing layer to hydrogen-containing fluid. In particular aspects, the hydrogen-containing fluid can comprise activated hydrogen from an $H_2$ plasma.

In one aspect, the invention includes a semiconductor processing method. A substrate having a patterned second composition over a silicon-containing first composition is provided. The second composition has one or more openings extending therethrough to substantially expose one or more silicon-containing surfaces of the first composition. In some aspects, the second composition can comprise one or more of silicon dioxide, silicon nitride, silicon oxynitride and aluminum oxide; and the first composition can consist essentially of, or consist of either silicon or conductively-doped silicon. Titanium silicide is formed along the first composition within the one or more openings. The formation of the titanium silicide occurs in a reaction chamber and comprises one or more iterations of the following sequence in the following order. At least one titanium halide is provided in the reaction chamber in the substantial absence of one or more hydrogen-containing reductants to selectively form a titanium-containing layer on the one or more silicon-containing surfaces of the first composition relative to the second composition; substantially all of any unreacted titanium halide in the reaction chamber is purged from the reaction chamber; and one or more hydrogen-containing reactants are provided in the reaction chamber and utilized during formation of titanium silicide from titanium of the titanium-containing layer.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing stage of an exemplary aspect of the present invention.

FIG. 2 is a view of the FIG. 1 fragment shown at a processing stage subsequent to that of FIG. 1.

FIG. 5 is a diagrammatic, cross-sectional view of an exemplary reaction chamber that can be utilized in accordance with exemplary aspects of the present invention.

FIG. 6 is a graphical view of exemplary processing conditions which can be utilized in an exemplary aspect of the present invention, and specifically shows an exemplary timing sequence of a titanium tetrachloride injection, an $H_2$ plasma injection, and a purge injection in an exemplary processing sequence.

DETAILED DESCRIPTION OF THE PREFERRED EMBODIMENTS

Figure 3:
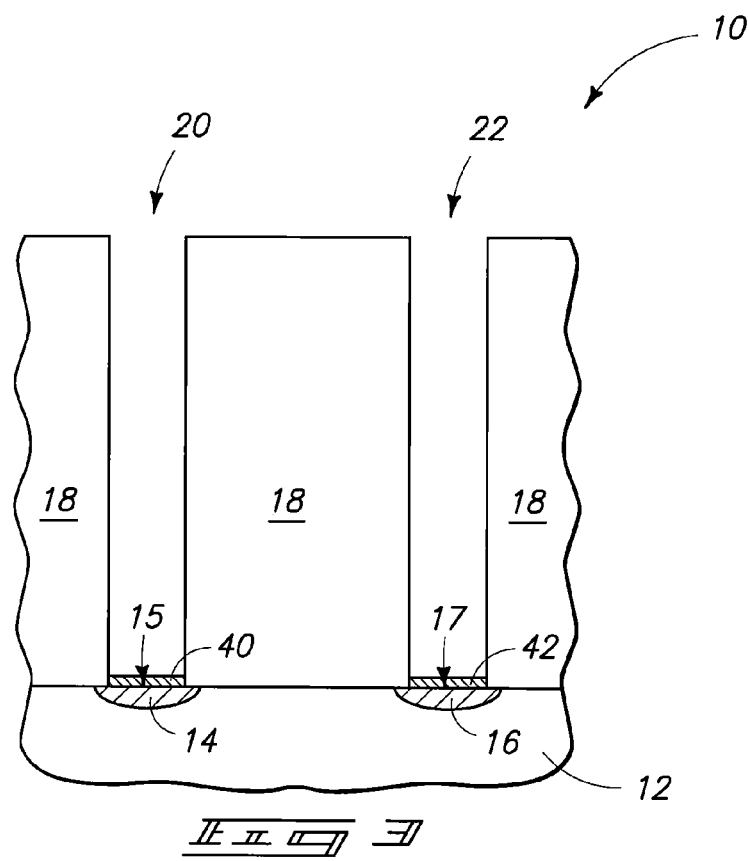
FIG. 3 is a view of the FIG. 1 fragment shown at a processing stage subsequent to that of FIG. 2.

This disclosure of the invention is submitted in furtherance of the constitutional purposes of the U.S. Patent Laws "to promote the progress of science and useful arts" (Article 1, Section 8).

The invention includes methods by which titanium-containing materials can be formed along semiconductor surfaces. In particular aspects, the invention includes methods of forming titanium silicide along silicon-containing surfaces. In some aspects, the methods can be utilized for selectively forming titanium silicide along surfaces consisting essentially of, or consisting of silicon or conductively-doped silicon relative to surfaces containing other materials (such as, for example, surfaces consisting essentially of, or consisting of one or more of silicon dioxide, silicon nitride, silicon oxynitride, aluminum oxide and carbon). In exemplary aspects, methods of the present invention can be utilized for forming titanium silicide at the bottom of high-aspect-ratio openings (such as, for example, openings having aspect ratios of at least 20), with such titanium silicide being substantially entirely in the C-54 phase.

Exemplary embodiments of the invention are discussed with reference to FIGS. 1-6.

Referring to FIG. 1, a semiconductor wafer fragment 10 is illustrated at a preliminary processing stage. Wafer fragment 10 comprises a semiconductor substrate 12 which can be, for example, a silicon-containing substrate. For instance, substrate 12 can comprise, consist essentially of, or consist of silicon in polycrystalline, amorphous or monocrystalline form. In exemplary aspects, substrate 12 can comprise monocrystalline silicon lightly-doped with background p-type dopant. In some aspects, substrate 12 can comprise a silicon-containing layer over one or more levels of integrated circuitry (not shown).

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 is shown having a pair of conductively-doped diffusion regions 14 and 16 extending therein. Diffusion regions 14 and 16 can be conductively-doped with p-type dopant and/or n-type dopant, as will be recognized by persons of ordinary skill in the art. The diffusion regions 14 and 16 have uppermost surfaces 15 and 17, respectfully, which can be referred to as silicon-containing surfaces. Such silicon-containing surfaces comprise conductively-doped silicon, and can consist essentially of, or consist of conductively-doped silicon.

A material 18 is formed over semiconductor substrate 12, and such material has openings 20 and 22 extending therethrough to conductively-doped regions 14 and 16, respectively. Material 18 can comprise any of numerous compositions or combinations of compositions, and in particular aspects will comprise, consist essentially of, or consist of one or more of silicon dioxide, silicon nitride, silicon oxynitride, aluminum oxide, and carbon (the carbon can be in any of numerous forms including, for example, amorphous form).

The openings 20 and 22 can be very high-aspect-ratio openings, and in particular aspects can comprise aspect ratios of at least 20.

Although structure 12 is referred to as being a semiconductor substrate in the discussion above, it is to be understood that the definition of substrate is broad enough so that the combination of structure 12 and material 18 can be referred to as a substrate in some aspects of the invention. In particular aspects, a substrate can be considered to comprise the base structure 12 as a silicon-containing first composition, and material 18 as a patterned second composition formed over the first composition. Such second composition has the openings 20 and 22 extending therethrough to expose one or more silicon-containing surfaces of the first composition 12.

Persons of ordinary skill in the art will recognize that surfaces of silicon-containing material frequently have a thin layer of native oxide (i.e. silicon dioxide) thereover. Thus, the construction 10 of FIG. 1 having silicon-containing surfaces 15 and 17 exposed within the openings 20 and 22 will typically not exist until native oxide is removed from over the surfaces 15 and 17. Such removal can be accomplished by, for example, a dip of construction 10 in hydrofluoric acid.

Although surfaces 15 and 17 are shown exposed at the exemplary processing stage of FIG. 1, it is to be understood that the invention encompasses other aspects in which the thin layer of native oxide is left over surfaces 15 and 17 during subsequent processing. Specifically, subsequent processing (discussed below) will form titanium-containing materials across surfaces 15 and 17. In some aspects of the invention, native oxide can be left over surfaces 15 and 17 during the initial formation of the titanium-containing materials, and such formation can be utilized to break up the native oxide, rather than using a separate processing step (such as, for example, a hydrofluoric acid dip) to remove the native oxide prior to formation of the titanium-containing materials.

In some aspects of the invention, the silicon-containing surfaces 15 and 17 can be considered to be "substantially exposed" by the openings 20 and 22, with the term "substantially exposed" indicating that the openings can either extend entirely to the silicon-containing surfaces 15 and 17, or can extend only nearly to surfaces 15 and 17 as would occur if a thin layer of native oxide were over layers 15 and 17. In any event, the exposure of surfaces 15 and 17 within openings 20 and 22 is sufficient so that titanium-containing materials can be formed over silicon-containing surfaces 15 and 17 in the subsequent processing discussed below.

Referring next to FIG. 2, titanium-containing layers 30 and 32 are formed along silicon-containing surfaces 15 and 17, respectively. The titanium-containing layers are formed by exposing construction 10 to at least one titanium-containing precursor in the absence of one or more dehalogenating reductants which will be used later in the process. For instance, titanium-containing layers 30 and 32 can be formed by exposing construction 10 to one or more titanium halides (such as, for example, titanium tetrachloride) in the absence of hydrogen-containing reductants that will be utilized later in the processing. In particular aspects, the titanium-containing precursor utilized to form layers 30 and 32 comprises, consists essentially of, or consists of titanium tetrachloride. In other words, at least one titanium-containing precursor can be utilized to form layers 30 and 32, and in some aspects such at least one precursor comprises titanium tetrachloride, consists essentially of titanium tetrachloride, or consists of titanium tetrachloride.

In the shown aspect of the invention, titanium-containing layers 30 and 32 are selectively formed on silicon-containing surfaces 15 and 17, and not on surfaces of material 14. In other words, titanium-containing layers 30 and 32 are formed with a high degree of selectivity for silicon-containing surfaces 15 and 17 relative to exposed surfaces of material 14. Such can be accomplished by utilizing titanium halide precursor (such as, for example, titanium tetrachloride) in the absence of a reducing agent that would otherwise dehalogenate the titanium halide. Thus, the titanium halide deposits on the silicon-containing surfaces in a self-limiting manner to form layers 30 and 32 of titanium halide bonded to the silicon-containing surfaces 15 and 17. If titanium tetrachloride is utilized as the titanium-containing precursor, the amount of titanium deposited typically increases for about 10 seconds, and then has reached the maximum thickness that will be deposited without dehalogenation of the deposited material.

In some aspects of the invention, material 14 comprises, consists essentially of, or consists of one or more of silicon dioxide, silicon nitride, silicon oxynitride, aluminum oxide and carbon; and titanium-containing layers 30 and 32 are selectively formed on silicon-containing surfaces of material 12 relative to surfaces of material 14. The silicon-containing surfaces of material 12 are shown to be conductively-doped silicon, but it is to be understood that the silicon surfaces onto which titanium is selectively deposited can be other than conductively-doped in some aspects of the invention.

The processing temperature utilized to form titanium-containing layers 30 and 32 is preferably from about 550° C. to about 700° C. If a temperature of less than about 550° C. is utilized, selectivity of deposition for silicon-containing surfaces 15 and 17 relative to surfaces of material 14 can be lessened or lost.

Referring next to FIG. 3, titanium-containing layers 30 and 32 are converted to titanium silicide materials 40 and 42. In particular aspects, materials 40 and 42 can comprise, consist essentially of, or consist of titanium silicide.

As discussed above, titanium-containing layers 30 and 32 will typically comprise titanium halide. The conversion of layers 30 and 32 to titanium silicide materials 40 and 42 can comprise exposing the layers 30 and 32 to suitable reductant which dehalogenates the titanium halide. Such dehalogenation is accompanied by migration of silicon from substrate 12 to layers 30 and 32. The silicon reacts with the titanium of layers 30 and 32 to form the silicide materials 40 and 42.

Any suitable reductant or combination of reductants can be utilized during formation of silicide materials 40 and 42. In some aspects the formation of the silicide materials utilizes hydrogen-containing reductant from a hydrogen-containing fluid (such as hydrogen-containing gas), and in particular aspects the formation of the silicide materials utilizes activated hydrogen from an $H_2$ plasma. The activated hydrogen can be in the form of, for example, one or more hydrogen-containing radicals.

The materials 40 and 42 can be considered to be a base layer of titanium silicide formed at the bottoms of openings 20 and 22. In subsequent processing, additional titanium silicide can be formed over layers 40 and 42 by repeating iterations of the processing discussed above. Specifically, a subsequent titanium halide layer can be formed over materials 40 and 42 in the absence of dehalogenating reductants, and subsequently the layer can be converted to titanium silicide by exposing the layer to suitable dehalogenating reductants. Such processing can be repeated a suitable number of times to form titanium silicide material at the bottoms of openings 20 and 22 to a desired thickness.

In particular aspects of the invention, the first layer of titanium silicide is formed under conditions which form substantially all of the first layer in C-54 phase. Such conditions can include a relatively short pulse of titanium halide (with a short titanium halide pulse being a pulse of less than 3 seconds, and typically from greater than 0 seconds to less than about 2 seconds), and a relatively long pulse of reductant, such as, for example, hydrogen-containing reductant (with a long pulse of reductant being a pulse of at least about 8 seconds, and typically being a pulse of from about 8 seconds to about 12 seconds).

The materials 40 and 42 can be considered to be "substantially entirely" in the C-54 phase if the materials are entirely in the C-54 phase (in other words, contain no detectable C-49 phase), or have only a small amount (typically less than 5%) of C-49 phase therein.

A base layer of $TiSi_2$ in C-54 phase can be utilized as a template for formation of subsequent layers of titanium silicide thereon so that the subsequent layers are in the C-54 phase, even if conditions are utilized for forming the subsequent layers that are not as conducive for C-54 phase formation as those utilized for forming the base layer. The conditions utilized for forming the subsequent layers of $TiSi_2$ can comprise, for example, longer pulses of titanium halide than utilized for forming the base layer (with longer titanium halide pulses being pulses of at least about 12 seconds, and typically being from about 12 seconds to about 14 seconds), and shorter pulses of dehalogenating reductants than utilized for forming the base layer (with the shorter pulses of dehalogenating reductants being less than or equal to about 6 seconds, and with exemplary short pulses being from about 4 seconds to about 6 seconds).

The relatively long pulse of titanium halide can form a thicker layer of titanium-containing material, which can subsequently translate into a thicker layer of titanium silicide formed in a single iteration of a processing sequence of the present invention, but will not be as favorable for formation of C-54 phase relative to C-49 phase as would a shorter pulse of titanium tetrachloride. Thus, it is advantageous to utilize the shorter pulse of titanium tetrachloride to establish the base layer of titanium silicide so that such base layer has low resistivity, and to then utilize the longer pulses of titanium tetrachloride to form the subsequent layers of titanium silicide over the base layer so that the base layer can be a template establishing low resistivity phase in the subsequently-formed layers of titanium silicide.

As discussed previously, some aspects of the invention can utilize multiple iterations of a sequence in which (1) titanium halide is used in the absence of dehalogenating reductants to form titanium-containing material on a substrate, and (2) the titanium-containing material is exposed to dehalogenating reductants to cause the titanium-containing material to convert to titanium silicide. In such aspects, it can be preferred that one of the earlier iterations utilize a relatively short exposure to titanium halide and long exposure to reductant (to form a C-54 phase base); and that a later iteration utilize a longer exposure to titanium halide and shorter exposure to reductant (to form more titanium silicide in a single iteration while using the C-54 base as a template to force the C-54 phase into the later-formed layer). It can be preferred that the earliest iteration utilize a short exposure to titanium halide and long exposure to reductant, and that all later iterations utilize long exposure to titanium halide and relatively short exposure to reductants. However, the exposure to reductants in the later processing can be long, if desired. The utilization of the short exposure to reductant is to save processing time. Generally, a relatively short exposure to reductant can sufficiently completely dehalogenate the titanium halide layers so that the layers convert completely to titanium silicide. However, if it is found that the short exposures to reductants are not sufficient, longer exposures can be utilized so that relatively complete conversion of the titanium halide layers to titanium silicide is accomplished.

Although the processing of FIGS. 1-3 is described for formation of titanium silicide, it is to be understood that other semiconductor materials besides silicon, or in addition to silicon, can be utilized in some aspects of the invention.

Figure 4:
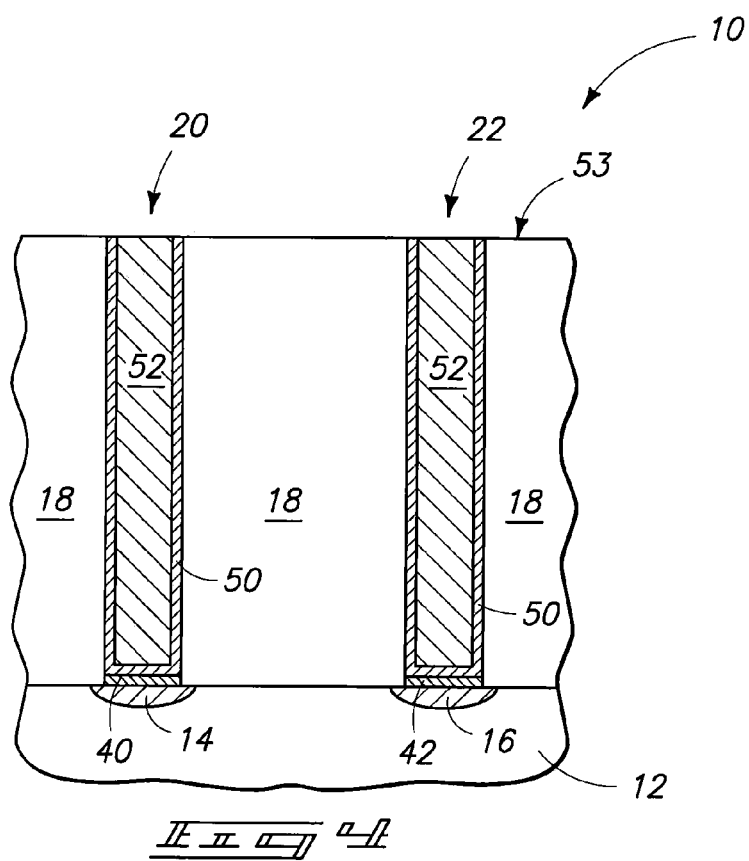
FIG. 4 is a view of the FIG. 1 fragment shown at a processing stage subsequent to that of FIG. 3.

Referring next to FIG. 4, conductive materials 50 and 52 are provided within openings 20 and 22 to form electrically conductive contacts extending to silicide materials 40 and 42. Material 50 can be an adhesion layer, such as, for example, titanium nitride, and in particular aspects can comprise, consist essentially of, or consist of titanium nitride. Layer 52 can be any suitable conductive material and in particular aspects can comprise, consist essentially of, or consist of tungsten. Materials 50 and 52 can be formed within openings 20 and 22 and over material 14, and subsequently subjected to planarization to form the shown planarized upper surface 53 extending across material 14 and across uppermost surfaces of materials 50 and 52.

In particular aspects of the invention, the conductively-doped regions 14 and 16 can be incorporated into integrated circuitry, such as, for example, a memory array. In such aspects, the conductively-doped regions can be source/drain regions that are electrically coupled with transistor devices (not shown), and the interconnects formed by materials 50 and 52 can extend to connect with bitline circuitry and/or capacitors.

The processing of FIGS. 1-3 for forming silicide materials 40 and 42 will typically be conducted in a reaction chamber. FIG. 5 shows an exemplary apparatus 100 which comprises a reaction chamber 102. An inlet 104 and an outlet 106 extend into the chamber. In operation, precursors are flowed into the chamber through the inlet, and subsequently reaction by-products and unreacted precursor are exhausted from the chamber through outlet 106.

A substrate holder 108 is within the chamber, and a substrate 110 is shown retained on the substrate holder. Such substrate can be, for example, a semiconductor substrate.

In operation, flow of precursor into the chamber, and exhausting of materials out of the chamber, is controlled by various devices. Such devices can include, for example, valves (not shown) and pumps (not shown). Also, purge cycles can be utilized for assisting in exhausting materials from the chamber prior to flowing of subsequent materials into the chamber.

An exemplary sequence which can be utilized in accordance with an aspect of the present invention is described with reference to FIG. 6. Such shows the relationship between pulses of titanium chloride, hydrogen plasma reductant, and purge materials within a reaction chamber.

Initially, a pulse 200 of titanium chloride is provided within the reaction chamber. Such pulse can be utilized to form titanium chloride-containing layers on silicon-containing surfaces, such as, for example, the layers 30 and 32 of FIG. 2.

A pulse 202 of purge gas is subsequently introduced into the chamber to remove substantially all of any reacted titanium chloride from the chamber, as well as to remove reaction by-products from the chamber. The term "substantially all" is utilized to indicate that there is so little titanium halide remaining after the purging that there is not enough titanium halide to significantly interfere with subsequent reaction processes occurring in the chamber, which can include, but is not limited to, applications in which there is no detectable titanium halide remaining in the reaction chamber after the purge.

Once the purging is completed, reductant material (specifically, hydrogen from hydrogen plasma in the shown aspect of the invention) is introduced into the chamber with a pulse 204. The reductant is utilized to form titanium silicide from the titanium layer previously formed with pulse 200, and can, for example, form the titanium silicide materials 40 and 42 of FIG. 3.

The pulses 200, 202 and 204 can be considered to correspond to one exemplary iteration of a processing sequence which can be utilized in accordance with an aspect of the present invention. As discussed previously, multiple iterations of such sequence can be used to form a titanium silicide material having a desired thickness. Accordingly, a purge 206 can be conducted after the reduction with the hydrogen from the hydrogen plasma to flush the chamber, and subsequently another pulse 208 of titanium chloride can be introduced into the chamber to form a new layer of titanium chloride over the silicide that had been formed with the pulses 200, 202 and 204. Subsequently, the reaction chamber can be purged with a purge pulse 210, and then the titanium chloride formed with the pulse 208 can be dehalogenated and converted to titanium silicide with a pulse 212 of activated hydrogen from a hydrogen plasma. Subsequent iterations can be conducted as desired to form the titanium silicide to a desired thickness.

It is noted that the processing sequence of FIG. 6 is an exemplary processing sequence, and that other processing sequences can be utilized in various aspects of the invention. For instance, the durations of the various pulses shown in FIG. 6 can be adjusted depending on the process so that the titanium chloride pulses vary in duration relative to one another and/or vary in duration relative to the pulses of activated hydrogen or purge materials; and the activated hydrogen pulses can vary in duration relative to one another and/or vary in duration relative to other pulses of a given sequence. Additionally, it is noted that the pulse 206 of purge material is an optional pulse, in that the invention encompasses aspects in which such pulse is not utilized. Rather, the reduction with hydrogen plasma is immediately followed with a pulse of titanium chloride.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming titanium silicide, comprising at least two iterations of the following sequence in the following order:

exposing a substrate to at least one titanium-containing precursor in the absence of hydrogen-containing fluid to form a titanium-containing layer on the substrate, the substrate comprising silicon; and forming titanium silicide from titanium of the titanium-containing layer, wherein the formation of the titanium silicide comprises exposure of the titanium-containing layer to hydrogen-containing fluid, and migration of silicon from the substrate to interact with titanium of the titanium-containing layer; and wherein an earlier of the at least two iterations has a shorter exposure of the substrate to the at least one titanium-containing precursor and longer exposure of the substrate to the hydrogen-containing fluid than a later of the at least two iterations; the earlier of the at least two iterations forming a first portion of the titanium silicide, said first portion being substantially entirely in the C-54 phase and thus being a C-54 phase template; the later of the at least two iterations forming a second portion of the titanium silicide, and comprising conditions less conducive to forming the C-54 phase than the earlier of the at least two iterations; the second portion being substantially entirely in the C-54 phase due, at least in part, to the C-54 phase being induced from the C-54 phase template.

2. The method of claim 1 wherein the hydrogen-containing fluid comprises activated hydrogen from a $H_2$ plasma.

3. The method of claim 1 wherein the hydrogen-containing fluid comprises hydrogen-containing radicals.

4. The method of claim 1 wherein the at least one titanium-containing precursor includes at least one titanium halide.

5. The method of claim 1 wherein the at least one titanium-containing precursor comprises titanium tetrachloride.

6. The method of claim 1 wherein the at least one titanium-containing precursor consists essentially of titanium tetrachloride.

7. The method of claim 1 wherein the at least one titanium-containing precursor consists of titanium tetrachloride.

8. A method of forming titanium silicide, comprising at least two iterations of the following sequence in the following order:
exposing a substrate to one or more titanium halides in the absence of one or more reductants to form a titanium-containing layer on the substrate, the substrate comprising silicon; and
forming titanium silicide from titanium of the titanium-containing layer, wherein the formation of the titanium silicide comprises exposure of the titanium-containing layer to the one or more reductants, and migration of silicon from the substrate to interact with titanium of the titanium-containing layer; and
wherein an earlier of the at least two iterations has a shorter exposure of the substrate to the one or more titanium halides and longer exposure of the substrate to the one or more reductants than a later of the at least two iterations; the earlier of the at least two iterations forming a first portion of the titanium silicide, said first portion being substantially entirely in the C-54 phase and thus being a C-54 phase template; the later of the at least two iterations forming a second portion of the titanium silicide, and comprising conditions less conducive to forming the C-54 phase than the earlier of the at least two iterations; the second portion being substantially entirely in the C-54 phase due, at least in part, to the C-54 phase being induced from the C-54 phase template.

9. The method of claim 8 wherein the one or more titanium halides include titanium tetrachloride.

10. The method of claim 8 wherein the one or more titanium halides consist essentially of titanium tetrachloride.

11. The method of claim 8 wherein the one or more reductants contain hydrogen.

12. The method of claim 8 wherein the substrate comprises monocrystalline silicon.

13. The method of claim 11 wherein the one or more reductants include activated hydrogen from a $H_2$ plasma.

14. The method of claim 11 wherein the one or more reductants consist of activated hydrogen from a $H_2$ plasma.

15. The method of claim 11 wherein the one or more reductants include hydrogen-containing radicals.

* * * * *

UNITED STATES PATENT AND TRADEMARK OFFICE
CERTIFICATE OF CORRECTION

PATENT NO. : 7,622,388 B2  Page 1 of 1
APPLICATION NO. : 12/044253
DATED : November 24, 2009
INVENTOR(S) : Jaydeb Goswami et al.

It is certified that error appears in the above-identified patent and that said Letters Patent is hereby corrected as shown below:

On the title page, item (73), in "Assignee", in column 1, line 1, delete Technolyg," and insert -- Technology, --, therefor.

Signed and Sealed this

Sixteenth Day of February, 2010

David J. Kappos
*Director of the United States Patent and Trademark Office*